(12) United States Patent
Mueller et al.

(10) Patent No.: US 11,942,452 B2
(45) Date of Patent: Mar. 26, 2024

(54) SEMICONDUCTOR MODULE ARRANGEMENT

(71) Applicant: Infineon Technologies AG, Neubiberg (DE)

(72) Inventors: Christian Robert Mueller, Schweinfurt (DE); Andressa Colvero Schittler, Soest (DE); Daniel Domes, Ruethen (DE); Andre Lenze, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 602 days.

(21) Appl. No.: 16/939,130

(22) Filed: Jul. 27, 2020

(65) Prior Publication Data

US 2021/0043605 A1    Feb. 11, 2021

(30) Foreign Application Priority Data

Aug. 7, 2019  (EP) ..................................... 19190491

(51) Int. Cl.
 *H01L 25/065*  (2023.01)
 *H01L 23/00*   (2006.01)
 (Continued)

(52) U.S. Cl.
 CPC ........ *H01L 25/0655* (2013.01); *H01L 23/049* (2013.01); *H01L 23/367* (2013.01);
 (Continued)

(58) Field of Classification Search
 CPC . H01L 25/0655; H01L 23/049; H01L 23/367; H01L 23/5383; H01L 23/642; H01L 24/48; H01L 2224/48225
 See application file for complete search history.

(56) References Cited

U.S. PATENT DOCUMENTS

2010/0127371 A1   5/2010  Tschirbs
2010/0284155 A1  11/2010  Stolze et al.
(Continued)

FOREIGN PATENT DOCUMENTS

DE    202015104615 U1    9/2015
DE    102017100532 A1    7/2018
EP         2765602 A1    8/2014

OTHER PUBLICATIONS

"10-PZ12NMA027MR-M340F68Y—datasheet", Vincotech, Jul. 17, 2015, 1-30.

*Primary Examiner* — Peniel M Gumedzoe
(74) *Attorney, Agent, or Firm* — Murphy, Bilak & Homiller, PLLC

(57) ABSTRACT

A semiconductor module arrangement includes a housing, a first semiconductor substrate arranged inside the housing, a second semiconductor substrate arranged inside the housing, a first plurality of controllable semiconductor elements, and a second plurality of controllable semiconductor elements. During operation of the semiconductor module arrangement, each controllable semiconductor element of the first plurality of controllable semiconductor elements generates switching losses and conduction losses, the switching losses being greater than the conduction losses. Further during operation of the semiconductor module arrangement, each controllable semiconductor element of the second plurality of controllable semiconductor elements generates switching losses and conduction losses, the conduction losses being greater than the switching losses. At least a first sub-group of the first plurality of controllable semiconductor elements is arranged on the first semiconductor substrate, and at least a first sub-group of the second plurality of controllable semiconductor elements is arranged on the second semiconductor substrate.

21 Claims, 5 Drawing Sheets

(51) Int. Cl.
*H01L 23/049* (2006.01)
*H01L 23/367* (2006.01)
*H01L 23/538* (2006.01)
*H01L 23/64* (2006.01)

(52) U.S. Cl.
CPC ........ *H01L 23/5383* (2013.01); *H01L 23/642* (2013.01); *H01L 24/48* (2013.01); *H01L 2224/48225* (2013.01)

(56) References Cited

U.S. PATENT DOCUMENTS

| | | | |
|---|---|---|---|
| 2012/0249032 A1 | 10/2012 | Toda et al. | |
| 2012/0307540 A1* | 12/2012 | Tagome | H03K 17/164 363/131 |
| 2014/0061673 A1* | 3/2014 | Miyanagi | H01L 23/49575 257/77 |
| 2014/0340124 A1* | 11/2014 | Hirler | H03K 17/168 327/108 |
| 2015/0236634 A1* | 8/2015 | Han | H02P 5/74 318/504 |
| 2016/0146676 A1* | 5/2016 | Ukegawa | G01K 3/10 374/178 |
| 2016/0334845 A1* | 11/2016 | Mittal | G05D 23/1906 |

\* cited by examiner

SEMICONDUCTOR MODULE ARRANGEMENT

TECHNICAL FIELD

The instant disclosure relates to semiconductor module arrangements comprising controllable semiconductor elements.

BACKGROUND

Semiconductor arrangements, like power semiconductor modules or the like, are widely used in automotive, industrial, and consumer electronic applications to drive loads, convert power, or the like. Such a semiconductor arrangement may include an ANPC (Active Neutral-Point Clamped) topology, for example. An ANPC topology includes several controllable semiconductor elements, each semiconductor element having a load path formed between a first load electrode (e.g. a source electrode or an emitter electrode) and a second load electrode (e.g. a drain electrode or a collector electrode), and a control electrode (e.g. a gate or base electrode).

There is a general need for a semiconductor module arrangement with highly symmetrical low-inductance commutation paths.

SUMMARY

A semiconductor module arrangement includes a housing, a first semiconductor substrate arranged inside the housing, a second semiconductor substrate arranged inside the housing, a first plurality of controllable semiconductor elements, and a second plurality of controllable semiconductor elements. During operation of the semiconductor module arrangement, each controllable semiconductor element of the first plurality of controllable semiconductor elements generates switching losses and conduction losses, wherein the switching losses are greater than the conduction losses, and, during operation of the semiconductor module arrangement, each controllable semiconductor element of the second plurality of controllable semiconductor elements generates switching losses and conduction losses, wherein the conduction losses are greater than the switching losses. At least a first sub-group of the first plurality of controllable semiconductor elements is arranged on the first semiconductor substrate, and at least a first sub-group of the second plurality of controllable semiconductor elements is arranged on the second semiconductor substrate.

Another semiconductor module arrangement includes a housing, a first semiconductor substrate arranged inside the housing, a second semiconductor substrate arranged inside the housing, a first plurality of controllable semiconductor elements, and a second plurality of controllable semiconductor elements. Each controllable semiconductor element of the first plurality of controllable semiconductor elements has a maximum permissible temperature, wherein, during operation of the semiconductor module arrangement, each controllable semiconductor element of the first plurality of controllable semiconductor elements reaches its maximum permissible temperature. Each controllable semiconductor element of the second plurality of controllable semiconductor elements has a maximum permissible temperature, wherein during operation of the semiconductor module arrangement, each controllable semiconductor element of the second plurality of controllable semiconductor elements does not reach its maximum permissible temperature. At least a first sub-group of the first plurality of controllable semiconductor elements is arranged on the first semiconductor substrate, and at least a first sub-group of the second plurality of controllable semiconductor elements is arranged on the second semiconductor substrate.

The invention may be better understood with reference to the following drawings and the description. The components in the figures are not necessarily to scale, emphasis instead being placed upon illustrating the principles of the invention. In the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line as described herein may be a single electrically conductive element or include at least two individual electrically conductive elements connected in series and/or parallel. Electrical lines may include metal and/or semiconductor material and may be permanently electrically conductive (i.e., non-switchable). An electrical line may have an electrical resistivity that is independent from the direction of a current flowing through it. A semiconductor body as described herein may be made of (doped) semiconductor material and may be a semiconductor chip or be included in a semiconductor chip. A semiconductor body has electrically connecting pads and includes at least one semiconductor element with electrodes. The pads are electrically connected to the electrodes, which includes that the pads may be the electrodes and vice versa.

Figure 1:
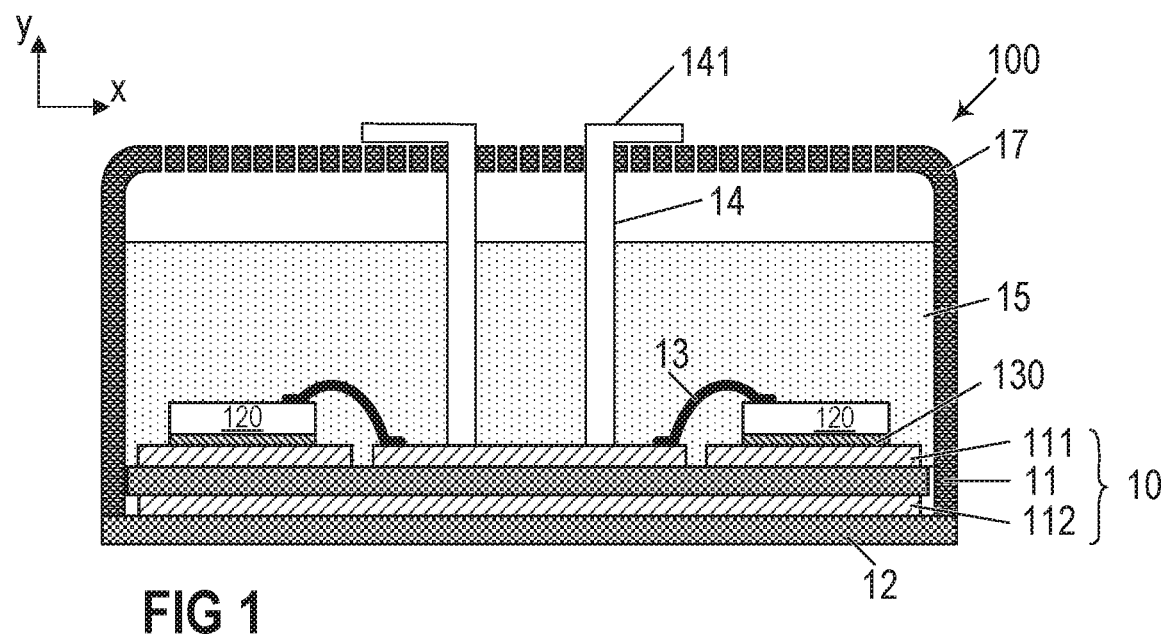
FIG. 1 schematically illustrates a cross-sectional view of a semiconductor module arrangement.

Referring to FIG. 1, a cross-sectional view of a power semiconductor module arrangement 100 is schematically illustrated. The power semiconductor module arrangement 100 includes a housing 17 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 17. In the example illustrated in FIG. 1, the semiconductor substrate 10 is arranged on a base plate 12 which forms a ground surface of the housing 17, while the housing 17 itself solely comprises sidewalls and a cover. This is, however, only an example. It is also possible that the housing 17 further comprises a ground surface and that the semiconductor substrate 10 and an (optional) base plate 12 be arranged inside the housing 17. In some power semiconductor module arrangements 100, more than one semiconductor substrate 10 is arranged on a single base plate 12 or on the ground surface of a housing 17. It is also possible that the semiconductor substrate 10 itself forms a ground surface of the housing 17. In such cases, the housing only comprises sidewalk and a cover but no ground surface and a base plate 12 may be omitted.

One or more semiconductor bodies 120 may be arranged on the at least one semiconductor substrate 10. Each of the semiconductor bodies 120 arranged on the at least one semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor) and/or any other suitable semiconductor element.

The one or more semiconductor bodies 120 may form a semiconductor arrangement on the at least one semiconductor substrate 10. In FIG. 1, only two semiconductor bodies 120 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer but includes recesses between different sections of the layer. Such recesses are schematically illustrated in FIG. 1. The first metallization layer 111 in this example includes three different sections. This, however, is only an example. Any other number of sections is possible. Different semiconductor bodies 120 may be mounted on the same or on different sections of the first metallization layer 111. Different sections of the first metallization layer 111 may have no electrical connection or may be electrically connected to one or more other sections using, e.g., bonding wires 13. Electrical connections 13 may also include connection plates or conductor rails, for example, to name just a few examples. The one or more semiconductor bodies 120 may be electrically and mechanically connected to the semiconductor substrate 10 by an electrically conductive connection layer 130. Such an electrically conductive connection layer may be a solder layer, a layer of an electrically conductive adhesive or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 14. The terminal elements 14 are electrically connected to the first metallization layer 111 and provide an electrical connection between the inside and the outside of the housing 17. The terminal elements 14 may be electrically connected to the first metallization layer 111 with a first end, while a second end 141 of each of the terminal elements 14 protrudes out of the housing 17. The terminal elements 14 may be electrically contacted from the outside at their respective second ends 141. A first part of the terminal elements 14 may extend through the inside of the housing 17 in a vertical direction y. The vertical direction y is a direction perpendicular to a top surface of the semiconductor substrate 10, wherein the top surface of the semiconductor substrate 10 is a surface on which the at least one semiconductor body 120 is mounted. The terminal elements 14 illustrated in FIG. 1, however, are only examples. Terminal elements 14 may be implemented in any other way and may be arranged anywhere within the housing 17. For example, one or more terminal elements 14 may be arranged close to or adjacent to the sidewalls of the housing 17. Terminal elements 14 could also protrude through the sidewalk of the housing 17 instead of through the cover.

The semiconductor bodies 120 each may include a chip pad metallization (not specifically illustrated), e.g., a source, drain, emitter, collector, anode, cathode or gate metallization. A chip pad metallization generally provides a contact surface for electrically connecting the semiconductor body 120. The chip pad metallization may electrically contact a connection layer 130, a terminal element 14 or an electrical connection 13, for example. A chip pad metallization may consist of or include a metal such as aluminum, copper, gold or silver, for example. The electrical connections 13 and the terminal elements 14 may also consist of or include a metal such as copper, aluminum, gold or silver, for example.

The power semiconductor module arrangement 100 generally further includes a casting compound 15. The casting compound 15 may consist of or include a silicone gel or may be a rigid molding compound, for example. The casting compound 15 may at least partly fill the interior of the housing 17, thereby covering the components and electrical connections that are arranged on the semiconductor substrate 10. The terminal elements 14 may be partly embedded in the casting compound 15. At least their second ends 141, however, are not covered by the casting compound 15 and protrude from the casting compound 15 through the housing 17 to the outside of the housing 17. The casting compound 15 is configured to protect the components and electrical connections inside the power semiconductor module 100, in particular inside the housing 17, from certain environmental conditions and mechanical damage.

As has been described above, two or more semiconductor bodies 120 may form a semiconductor arrangement on the at least one semiconductor substrate 10. Arranging two or more semiconductor bodies 210 in a half-bridge arrangement is only one example. A semiconductor arrangement may also include, e.g., an ANPC (Active Neutral-Point Clamped) topology, for example. An ANPC topology includes several controllable semiconductor elements, each semiconductor element having a load path formed between a first load electrode (e.g. a source electrode or an emitter electrode) and a second load electrode (e.g. a drain electrode or a collector electrode), and a control electrode (e.g. a gate or base electrode).

Figure 2:
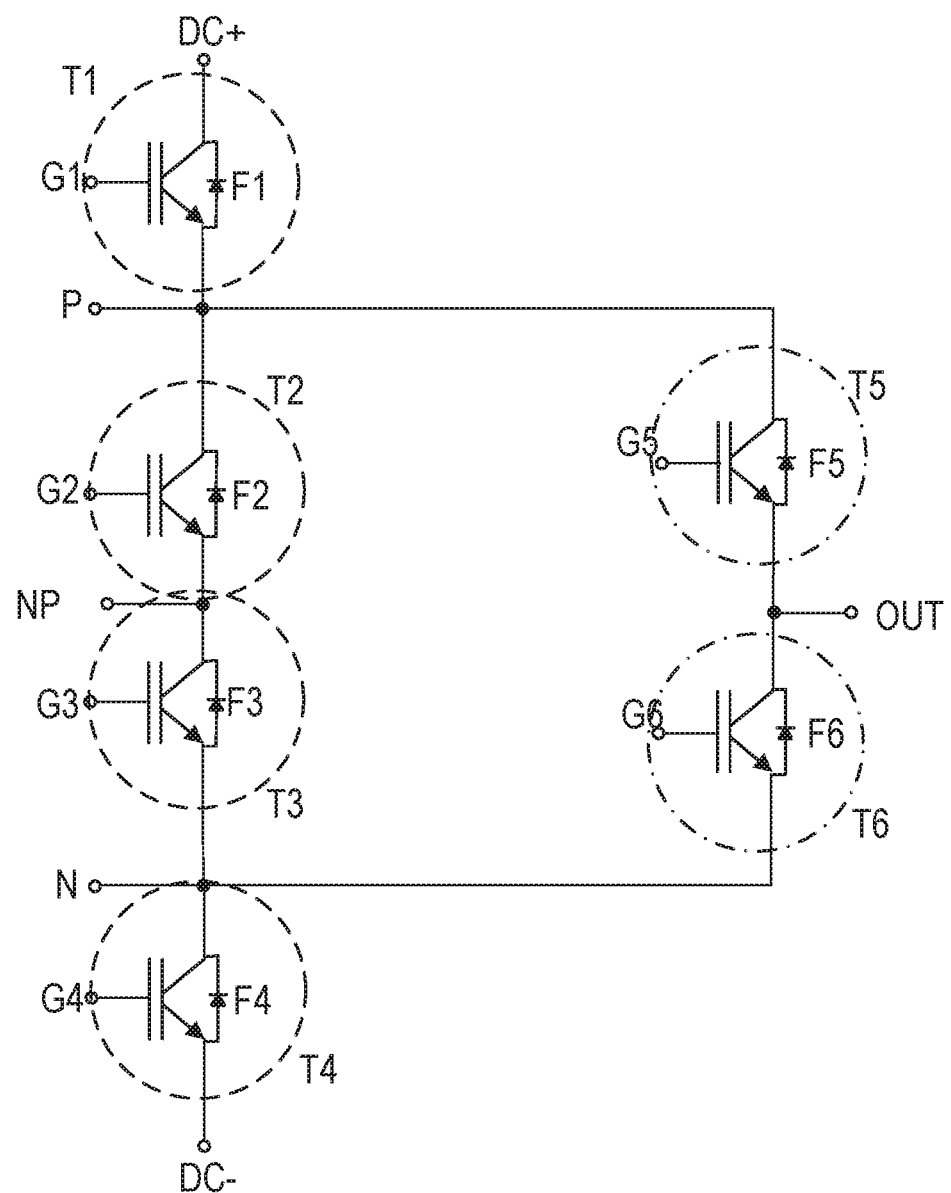
FIG. 2 is a circuit diagram of an exemplary semiconductor arrangement.

Now referring to FIG. 2, an exemplary semiconductor arrangement is schematically illustrated. The semiconductor arrangement of FIG. 2. may include and may be operated in the way of an ANPC (Active Neutral-Point Clamped) topology. The semiconductor arrangement in FIG. 2 includes a first supply node DC+ which is configured to be operatively connected to a first electrical potential. The semiconductor arrangement further includes a second supply node NP which is configured to be operatively connected to a second electrical potential. A third supply node DC− is configured to be operatively connected to a third electrical potential. The first potential is positive with reference to the second potential and the third potential is negative with reference to the second potential. The arrangement further includes a first controllable semiconductor element T1 and a second controllable semiconductor element T2. Each of the first controllable semiconductor element T1 and the second controllable semiconductor element T2 includes a control electrode G1, G2 and a controllable load path between a first load electrode and a second load electrode. The load paths of the first controllable semiconductor element T1 and the second controllable semiconductor element T2 are coupled in series and between the first supply node DC+ and the second supply node NP.

The arrangement further includes a third controllable semiconductor element T3 and a fourth controllable semiconductor element T4. Each of the third controllable semiconductor element T3 and the fourth controllable semiconductor element T4 includes a control electrode G3, G4 and a controllable load path between a first load electrode and a second load electrode. The load paths of the third controllable semiconductor element T3 and the fourth controllable semiconductor element T4 are coupled in series and between the second supply node NP and the third supply node DC−.

The first controllable semiconductor element T1 and the second controllable semiconductor element T2 are connected to each other via a first common node P, and the third controllable semiconductor element T3 and the fourth controllable semiconductor element T4 are connected to each other via a second common node N.

The arrangement further includes a fifth controllable semiconductor element T5 having a control electrode G5 and a controllable load path between two load electrodes, the load path being operatively connected between the first common node P and an output node OUT, and a sixth controllable semiconductor element T6 having a control electrode G6 and a controllable load path between two load electrodes, the load path being operatively connected between the output node OUT and the second common node N.

Each of the controllable semiconductor elements T1, T2, T3, T4, T5, T6 may include one or more switching elements, each switching element having a control electrode and a controllable load path between a first load electrode and a second load electrode, the load paths of the switching elements of a controllable semiconductor element being operatively connected in parallel between the nodes between which the respective controllable semiconductor element is connected.

Each of the individual switching elements may be implemented as a separate semiconductor body 120, as has been described with respect to FIG. 1 above. Each of the controllable semiconductor elements T1-T6 in the arrangement of FIG. 2 may include at least one intrinsic freewheeling element F1, F2, F3, F4, F5, F6 such as a body diode, which is electrically connected between the first load electrode and the second load electrode of the respective controllable semiconductor element T1-T6. If a controllable semiconductor element T1-T6 comprises more than one individual switching element coupled in parallel, each of the individual switching elements may comprise an intrinsic freewheeling element. However, it is also possible that an external diode element is coupled in parallel to each of the controllable semiconductor elements T1-T6. Each of such external diode elements may be implemented as a separate semiconductor body 120, for example.

A current commutation path of the semiconductor arrangement of FIG. 2 generally runs through the first controllable semiconductor element T1 and the second freewheeling element F2, for example, if the topology is operated in the way of a so-called ANPC1 topology (fifth controllable semiconductor element T5 conducting permanently, output current and output voltage both positive). Another current commutation path of the semiconductor arrangement of FIG. 2 generally runs through the fourth controllable semiconductor element T4 and the third freewheeling element F3, for example, if the topology is operated in the way of a so-called ANPC1 topology (sixth controllable semiconductor element T6 conducting permanently, output current and output voltage both negative).

A current commutation path of the semiconductor arrangement of FIG. 2. generally runs through the fifth controllable semiconductor element T5, the third controllable semiconductor element T3 and the sixth freewheeling element F6, for example, if the topology is operated in the way of a so-called ANPC2 topology (first controllable semiconductor element T1 conducting permanently, output current and output voltage both positive). Another current commutation path of the semiconductor arrangement of FIG. 2 generally runs through the sixth controllable semiconductor element T6, the second controllable semiconductor element T2 and the fifth freewheeling element F5, for example, if the topology is operated in the way of a so-called ANPC2 topology (fourth controllable semiconductor element T4 conducting permanently, output current and output voltage both negative).

Figure 3:
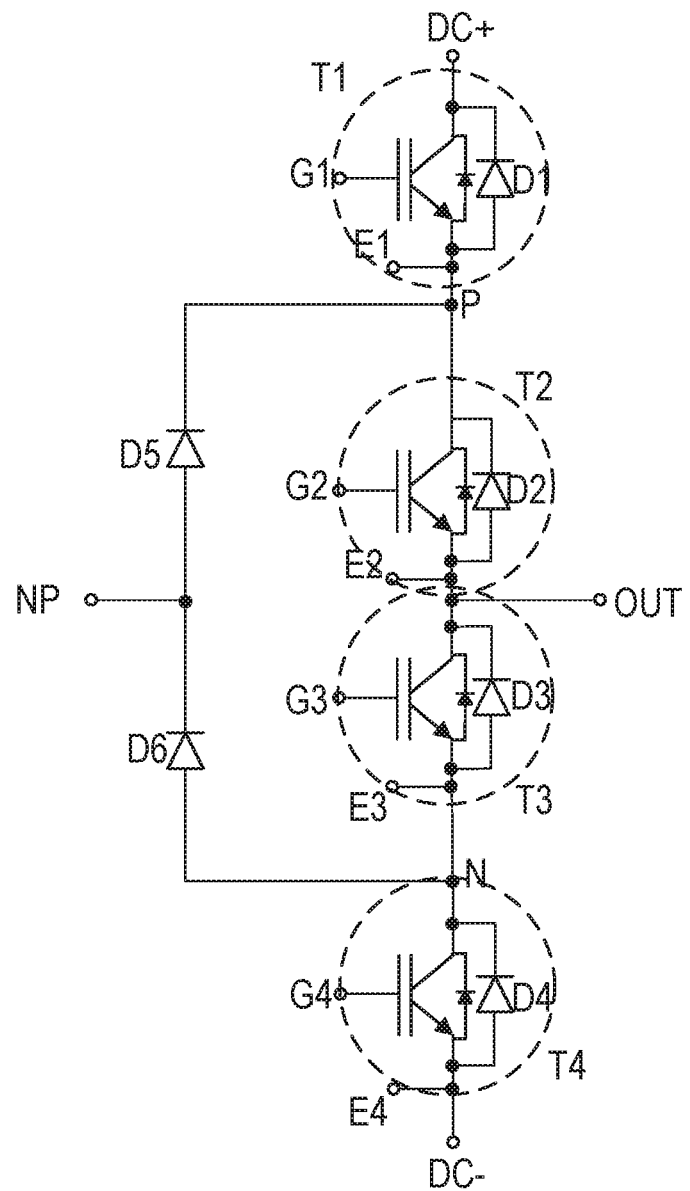
FIG. 3 is a circuit diagram of another exemplary semiconductor arrangement.

Now referring to FIG. 3, another exemplary semiconductor arrangement is schematically illustrated. The semiconductor arrangement of FIG. 3 may include and may be operated in the way of an NPC1 (Neutral-Point Clamped 1) topology. The semiconductor arrangement in FIG. 3 includes a first supply node DC+ which is configured to be operatively connected to a first electrical potential. The semiconductor arrangement further includes a second supply node NP which is configured to be operatively connected to a second electrical potential. A third supply node DC− is configured to be operatively connected to a third electrical potential. The first potential is positive with reference to the second potential and the third potential is negative with reference to the second potential. The arrangement further includes a first controllable semiconductor element T1 and a second controllable semiconductor element T2. Each of the first controllable semiconductor element T1 and the second controllable semiconductor element T2 includes a control electrode G1, G2 and a controllable load path between a first load electrode and a second load electrode. The load paths of the first controllable semiconductor element T1 and the second controllable semiconductor element T2 are coupled in series and between the first supply node DC+ and an output node OUT.

The arrangement further includes a third controllable semiconductor element T3 and a fourth controllable semiconductor element T4. Each of the third controllable semiconductor element T3 and the fourth controllable semiconductor element T4 includes a control electrode G3, G4 and a controllable load path between a first load electrode and a second load electrode. The load paths of the third controllable semiconductor element T3 and the fourth controllable semiconductor element T4 are coupled in series and between the output node OUT and the third supply node DC−.

The first controllable semiconductor element T1 and the second controllable semiconductor element T2 are connected with each other via a first common node P, and the third controllable semiconductor element T3 and the fourth controllable semiconductor element T4 are connected with each other via a second common node N.

Each of the controllable semiconductor elements T1, T2, T3, T4, may include one or more switching elements, each switching element having a control electrode and a controllable load path between a first load electrode and a second load electrode, the load paths of the switching elements of a controllable semiconductor element being operatively connected in parallel between the nodes between which the respective controllable semiconductor element is connected.

Each of the individual switching elements may be implemented as a separate semiconductor body 120, as has been described with respect to FIG. 1 above. Each of the controllable semiconductor elements T1-T4 in the arrangement of FIG. 3 may include at least one intrinsic freewheeling element F1, F2, F3, F4, such as a body diode, which is electrically connected between the first load electrode and the second load electrode of the respective controllable semiconductor element T1-T4. If a controllable semiconductor element T1-T4 comprises more than one individual switching element coupled in parallel, each of the individual switching elements may comprise an intrinsic freewheeling element. However, it is also possible that an external diode element is coupled in parallel to each of the controllable semiconductor elements T1-T4. Each of such external diode element may be implemented as a separate semiconductor body 120.

The arrangement further includes a fifth diode element D5, the fifth diode element D5 being operatively connected between the second supply node NP and the first common node P, and a sixth diode element D6, the sixth diode element D6 being operatively connected between the second common node N and the second supply node NP.

In the arrangement of FIG. 3, a first current commutation path may run from the first supply node DC+ through the first controllable semiconductor element T1 and further through the fifth diode element D5 to the second supply node ND, while the second controllable semiconductor element T2 is conducting (output voltage and output current both positive). A second current commutation path may run from the third supply node DC− through the fourth controllable semiconductor element T4 and the sixth diode element D6 to the second supply node ND, while the third controllable semiconductor element T3 is conducting (output voltage and output current both negative).

Figure 4:
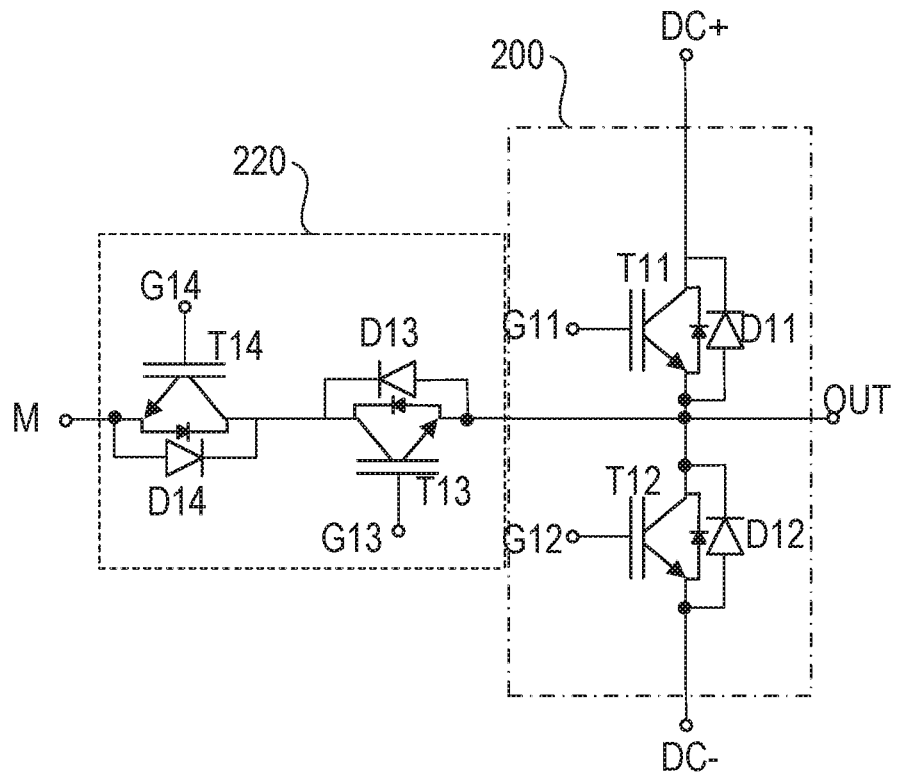
FIG. 4 is a circuit diagram of another exemplary semiconductor arrangement.

Now referring to FIG. 4, another exemplary semiconductor arrangement is schematically illustrated. The semiconductor arrangement of FIG. 4 may include and may be operated in the way of an NPC2 (Neutral-Point Clamped 2) topology. In particular, FIG. 4 is a circuit diagram of an exemplary three-level NPC2 topology. The NPC2 topology of FIG. 4 comprises a half-bridge module 200 and a common collector module 220. A typical NPC topology comprises four controllable semiconductor elements T11, T12, T13, T14 such as IGBTs (Insulated-Gate Bipolar Transistor), MOSFETs (Metal-Oxide-Semiconductor Field-Effect Transistor), JFETs (Junction Field-Effect Transistor), or HEMTs (High-Electron-Mobility Transistor), for example, and four diode elements D11, D12, D13, D14.

The half-bridge module 200 is configured to convert a DC voltage provided at an input DC+, DC− of the half-bridge module 200 into an AC voltage provided at an output node OUT of the half-bridge module 200. The AC voltage may be provided to, e.g., a load (not illustrated) that is coupled to the output node OUT of the half-bridge module 200. The half-bridge module 200 is coupled between a first supply node DC +, which is configured to be operatively coupled to a first electrical potential, and a second supply node DC−, which is configured to be operatively coupled to a second electrical potential. The first electrical potential may be a positive potential and the second electrical potential may be a negative potential in order to supply a DC voltage via the first and second supply nodes DC+, DC−. The first and second supply nodes DC+, DC− form the input of the half-bridge module 200.

The half-bridge module 200 may include one high-side switch T11 (also referred to as first controllable semiconductor element, or first switch) and one low-side switch T12 (also referred to as second controllable semiconductor element, or second switch) coupled in series to each other and between the first supply node DC+ and the second supply node DC−. The half-bridge module 200 may be configured to drive a load. (not specifically illustrated) at its output node OUT. The load may be an inductive load, for example. The output node OUT is electrically connected to a common node between the high-side switch T11 and the low-side switch T12.

In the circuit arrangement of FIG. 4, each controllable semiconductor element T11, T12 of the half-bridge module 200 is implemented as an IGBT (insulated-gate bipolar transistor). Each of the controllable semiconductor elements T11, T12 may comprise an external freewheeling diode element D11, D12 coupled in parallel to the respective controllable semiconductor element T11, T12. According to another example, each of the controllable semiconductor elements T11, T12 comprises two or more separate switching elements electrically coupled in parallel to each other (not specifically illustrated).

Each of the first controllable semiconductor element T11 and the second controllable semiconductor element T12 includes a control electrode G11, G12 and a controllable load path between a first load electrode (e.g., emitter electrode) and a second load electrode (e.g., collector electrode). The load paths of the first controllable semiconductor element T11 and the second controllable semiconductor element T12 are coupled in series and between the first supply node DC+ and the second supply node DC−.

The common collector module 220 comprises a third controllable semiconductor element T13, a fourth controllable semiconductor element T14, a third diode D13, and a fourth diode D14. Each of the third controllable semiconductor element T13 and the fourth controllable semiconductor element T14 includes a control electrode G13, G14 and a controllable load path between a first load electrode (e.g., emitter electrode) and a second load electrode (e.g., collector electrode). The load paths of the third controllable semiconductor element T13 and the fourth controllable semiconductor element T14 are coupled in series between a fourth neutral node M and the output node OUT. In this series connection of the third controllable semiconductor element T13 and the fourth controllable semiconductor element T14, the second load electrode (e.g., collector electrode) of the third controllable semiconductor element T13 is coupled to the second load electrode (e.g., collector electrode) of the fourth controllable semiconductor element T14. The first load electrode (e.g., emitter electrode) of the third controllable semiconductor element T13 is coupled to the output node OUT, and the first load electrode (e.g., emitter electrode) of the fourth controllable semiconductor element T14 is coupled to the fourth neutral node M. The third diode element D13 is coupled in parallel to the third controllable semiconductor element T13 between the output node OUT and the fourth controllable semiconductor element T14, wherein an anode of the third diode element D13 is coupled to the output node OUT, and a cathode of the third diode element D13 is coupled to the second load electrode of the fourth controllable semiconductor element T14. The fourth diode element D14 is coupled in parallel to the fourth controllable semiconductor element T14 between the fourth neutral node M and the second load electrode of the third controllable semiconductor element T13, wherein an anode of the fourth diode element D14 is coupled to the fourth neutral node M, and a cathode of the fourth diode element D14 is coupled to the second load electrode of the third controllable semiconductor element T13.

According to one example, each of the controllable semiconductor elements T13, T14 of the common collector module 220 comprises two or more separate switching elements electrically coupled in parallel to each other (not specifically illustrated).

A current commutation path of the semiconductor arrangement of FIG. 4 generally runs through both of the half-bridge module 200 and the common collector module 220. In particular, a commutation path may run from the first supply node DC+ through the first controllable semiconductor element T11 and further through the third controllable semiconductor element T13 and the fourth diode element D14 to the fourth neutral node M (third controllable semiconductor element T13 permanently conductive, output voltage and output current both positive). A commutation path may also run from the second supply node DC− through the second controllable semiconductor element T12 and further through the third diode element D13 and the fourth controllable semiconductor element T14 to the fourth neutral node M (fourth controllable semiconductor element T14 permanently conducting, output voltage and output current both negative).

In each of the semiconductor arrangements that have been exemplarily described with respect to FIGS. 2, 3 and 4 above, each of the controllable semiconductor elements T1, T2, T3, T4, T5, T6, T11, T12, T13, T14 may be either a fast switching element or a slow switching element. A fast switching element generally is a switching element that can perform a switching operation (e.g., from the on-state to an off-state or vice versa) at a certain speed. A threshold speed may be defined in this regard. If a switching element switches faster than the threshold speed, it may be defined as fast switching element. If a switching element switches slower than the threshold speed, it may be defined as slow switching element. For example, a switching element having a turn-on time of <100 ns (nanoseconds) and a turn-off time of <100 ns, may be seen as a fast switching device, and a switching element having a turn-on time of ≥100 ns (nanoseconds) and a turn-off time of ≥100 ns, may be seen as a slow switching device. Fast switching devices are generally more expensive than slow switching devices. Using different kinds of controllable semiconductor elements (fast switching and slow switching elements), however, is only an example. It is also possible to use the same kind of controllable semiconductor elements for all of the controllable semiconductor elements T1, T2, T3, T4, T5, T6, T11, T12, T13, T14 and to use different kinds of control circuits for the different controllable semiconductor elements T1, T2, T3, T4, T5, T6, T11, T12, T13, T14. Depending on the respective control circuit, a controllable semiconductor element exhibits a different switching behavior. That is, some controllable semiconductor elements may perform fast switching operations while other controllable semiconductor elements may perform slow switching operations. A different switching behavior of the controllable semiconductor elements may also be supported by means of different electromagnetic compatibility (EMC) filtering. Such EMC-filtering may be implemented within the semiconductor substrate 10 or electrical connections (e.g., bonding wires).

Generally, in the semiconductor arrangements described above as well as in other semiconductor arrangements it is not necessary to implement all of the switching devices as fast switching devices. In many semiconductor arrangements it is sufficient to implement only some of the switching devices as fast switching devices. By implementing at least some of the switching devices as slow switching devices, the overall cost of a power semiconductor module arrangement may be reduced.

Generally, each switching device, during operation, generates switching losses as well as conduction losses. According to one example, switching elements that, during operation, generate more switching losses than conduction losses may be implemented as fast switching devices, for example. Any other switching devices which, during operation, generate more conduction losses than switching losses may be implemented as slow switching devices, for example.

In the semiconductor arrangement of FIG. 2, for example, in a so-called ANPC1 topology, switching elements T1, T2, T3 and T4 may be implemented as fast switching elements, while switching elements T5 and T6 are implemented as slow switching elements. For example, if the fifth switching element T5 of the semiconductor arrangement of FIG. 2 is permanently conducting, a positive output voltage and positive output current may be provided at the output node OUT if the first switching element T1 and the second diode element D2 are conducting (first diode element D1 and second switching element T2 are not conducting). If the sixth switching element T6 is permanently conducting, a negative output voltage and a negative output current may he provided at the output node OUT if the fourth switching element T4 and the third diode element D3 are conducting (fourth diode element D4 and third switching element T3 are not conducting). As the fifth switching element T5 and the sixth switching element T6 are each permanently conducting over a longer period, it is not necessary to implement them as fast switching elements.

According to another example, (e.g., ANPC2 topology) it is also possible to implement switching elements T1, T2, T3, and T4 as slow switching elements, and switching elements T5 and T6 as fast switching elements. If the first switching element T1 is permanently conducting, a positive voltage and a positive current are provided at the output node OUT if the fifth switching element T5, the third switching element and the sixth diode element D6 are conducting. If the fourth switching element T4 is permanently conducting, a negative voltage and a negative current may be provided at the output node OUT, if the sixth switching element T6, the second switching element T2 and the fifth diode element D5 are conducting. As the first switching element T1 and the fourth switching element T4 are each permanently conducting for at least a certain period, it is not necessary to implement them as fast switching elements.

Each semiconductor arrangement or topology generally comprises a very unique implementation/realization that may lead to an optimized balance between switching losses and conduction losses. The semiconductor substrate on which a semiconductor body is mounted, however, also may have an impact on the thermal and electrical performance of the respective semiconductor body. Therefore, the kind of substrate may be chosen depending on the kind of semiconductor bodies that are mounted thereon. However, as has been described above, different semiconductor bodies of the same semiconductor arrangement may have different requirements concerning the kind of semiconductor substrate that is used.

Figure 5:
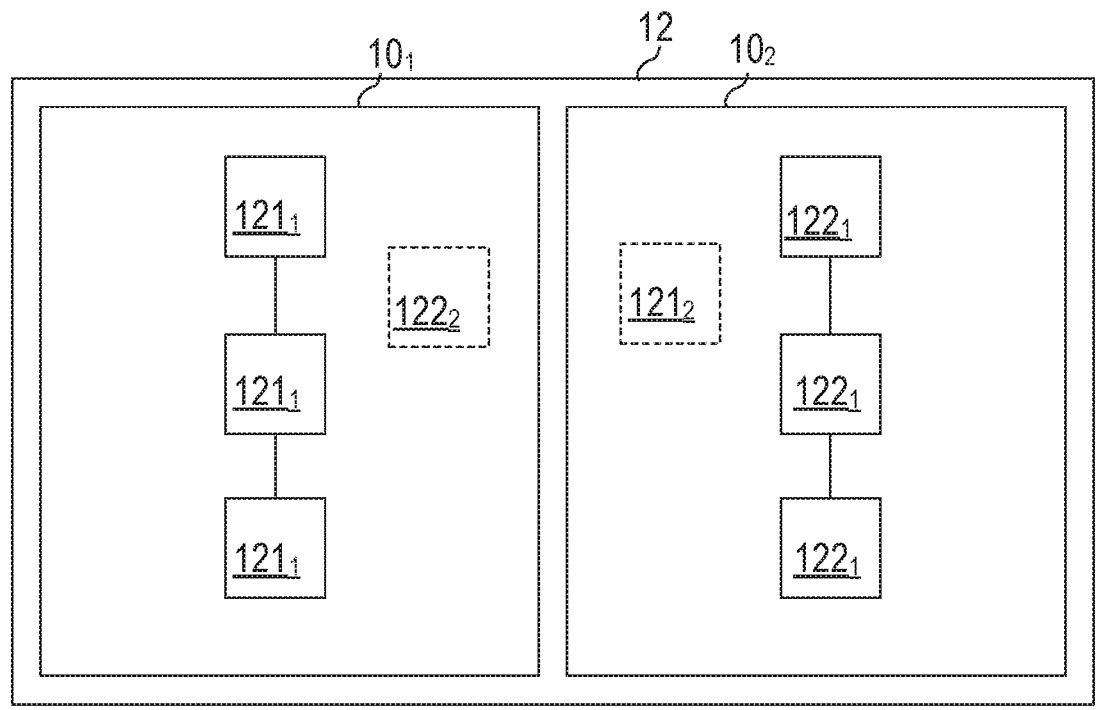
FIG. 5 is a top view of an exemplary semiconductor module arrangement.

Therefore, in the example illustrated in FIG. 5, one semiconductor module comprises two different semiconductor substrates $10_1$, $10_2$. Each of a first semiconductor substrate $10_1$ and a second semiconductor substrate $10_2$ may have a dielectric insulation layer 11 and a first metallization layer 111 mounted thereon, as has been described with respect to FIG. 1 above. The first metallization layer 111 of the first semiconductor substrate $10_1$ may be a structured metallization layer comprising two or more different individual sections. The same applies to the first metallization layer 111 of the second semiconductor substrate $10_2$ which may also be a structured layer comprising two or more individual sections. The first semiconductor substrate $10_1$ and the second semiconductor substrate $10_2$ may have different thermal and/or electrical properties (thermal and/or electrical designs). Different thermal properties may result from the dielectric insulation layer 11 of the first substrate $10_1$ comprising a different material than the dielectric insulation layer of the second substrate $10_2$. For example, the dielectric insulation layer 11 of the first substrate 101 may comprise only one material or a compound of two or more materials. The dielectric insulation layer 11 of the second substrate $10_2$ may also comprise only one material or a compound of two or more materials. At least one of the materials, however, may be different in the second substrate $10_2$ as compared to the first substrate $10_1$. That is, at least one material that is included in the second substrate $10_2$ is not included in the first substrate $10_1$. For example, one of the first and the second substrate $10_1$, $10_2$ may comprise fillers, while the other substrate may not comprise any fillers. According to another example, both substrates $10_1$, $10_2$ comprise fillers, but the fillers of the first substrate $10_1$ are of a different material as compared to the fillers of the second substrate $10_2$.

The thermal properties (thermal design) of a substrate generally affects the temperature of the controllable semiconductor elements that are mounted thereon. For example, if a substrate has a high thermal conductivity, heat that is generated by the controllable semiconductor elements mounted thereon may be conducted away more efficiently as compared to a substrate having a lower thermal conductivity. Therefore, controllable semiconductor elements that are mounted on a substrate having a higher thermal conductivity, during operation, may have a lower temperature than other controllable semiconductor elements that are mounted on a substrate having a lower thermal conductivity, even if the same number of switching operations is performed by all of the controllable semiconductor elements. The electrical properties (electrical design) of a substrate may affect the switching behavior of the controllable semiconductor elements that are mounted thereon. That is, for example, the material of the metallization layers of a substrate as well as the thickness of the metallization layers may affect the switching behavior of the controllable semiconductor elements mounted thereon.

The semiconductor arrangement may comprise a first plurality of switching elements 121 and a second plurality of switching elements 122. The first plurality of switching elements 121 comprises a first sub-group $121_1$ and a second sub-group $121_2$. The first sub-group $121_1$ comprises a first number A of switching elements, with A≥1. The second sub-group $121_2$ comprises a second number B of switching elements, with B≥0, and A>B. The first sub-group $121_1$ of the first plurality of switching elements 121 is arranged on the first substrate $10_1$. The second sub-group $121_2$ of the first plurality of switching elements 121 may be arranged either on the first substrate $10_1$ or on the second substrate $10_2$. That is, more than 50% of the switching elements of the first plurality of switching elements 121 are arranged on the first substrate $10_1$. For example, more than 60%, more than 75%, more than 90%, or 100% of the switching elements of the first plurality of switching elements 121 may be arranged on the first substrate $10_1$. A comparably small percentage or none of switching elements of the first plurality of switching elements 121 may be arranged on the second substrate $10_2$. The first substrate $10_1$ may comprise one or more materials that improve or support the thermal and/or the electrical performance of the first plurality of switching elements 121. Even if a small percentage of the switching elements of the first plurality of switching elements 121 is arranged on the second substrate $10_2$, which might not improve or support the thermal and/or the electrical performance of the first plurality of switching elements 121, the overall performance of the semiconductor arrangement will only be marginally affected in a negative way.

The second plurality of switching elements 122 comprises a third sub-group $122_1$ and a fourth sub-group $122_2$. The third sub-group $121_3$ comprises a third number C of switching elements, with C≥1. The fourth sub-group $121_4$ comprises a fourth number D of switching elements, with D≥0, and C>D. The third sub-group $121_3$ of the second plurality of switching elements 122 is arranged on the second substrate $10_2$. The fourth sub-group $121_4$ of the second plurality of switching elements 122 may be arranged either on the second substrate $10_2$ or on the first substrate $10_1$. That is, more than 50% of the switching elements of the second plurality of switching elements 122 are arranged on the second substrate $10_2$. For example, more than 60%, more than 75%, more than 90%, or 100% of the switching elements of the second plurality of switching elements 122 may be arranged on the second substrate $10_2$. A comparably small percentage or none of switching elements of the second plurality of switching elements 122 may be arranged on the first substrate $10_1$. The second substrate $10_2$ may comprise one or more materials that improve or support the thermal and/or the electrical performance of the second plurality of switching elements 122. Even if a small percentage of the switching elements of the second plurality of switching elements 122 is arranged on the first substrate 10$_1$, which might not improve or support the thermal and/or the electrical performance of the second plurality of switching elements 122, the overall performance of the semiconductor arrangement will only be marginally affected. in a negative way.

The first substrate 10$_1$ and the second substrate 10$_2$ are arranged within the same package 17. If the semiconductor module arrangement comprises a base plate 12, the first substrate 10$_1$ and the second substrate 10$_2$ are mounted on the same base plate 12 and the base plate 12 with the substrates 10$_1$, 10$_2$ mounted thereon may be arranged in the package 17 or the base plate 12 with the substrates 10$_1$, 10$_2$ mounted thereon may form a bottom of the package 17. The first substrate 10$_1$ may be electrically coupled to the second substrate 10$_2$ by means of bonding wires, bonding ribbons, connection plates or conductor rails, for example. During operation of the power semiconductor module, a commutation path may pass both the first substrate 10$_1$ and the second substrate 10$_2$, The switching elements of the first plurality of switching elements 121 may have common thermal and electrical characteristics and the switching elements of the second plurality of switching elements 122 may have common thermal and electrical characteristics that are different from the thermal and electrical characteristics of the switching elements of the first plurality 121.

According to one example, the switching elements of the first plurality of switching elements 121 are fast switching elements that perform a switching operation (e.g., from the on-state to an off-state or vice versa) at a certain speed that is above a certain threshold speed. For example, the switching elements of the first plurality of switching elements 121 may have a turn-on time of <100 ns (nanoseconds) and a turn-off time of <100 ns. The switching elements of the second plurality of switching elements 122 may be implemented as slow switching elements that perform a switching operation at a certain speed that is below the threshold speed. For example, the switching elements of the second plurality of switching elements 122 may have a turn-on time of ≥100 ns (nanoseconds) and a turn-off time of ≥100 ns.

According to another example, the switching elements of the first plurality of switching elements 121, during operation, generate switching losses and conduction losses, wherein the conduction losses are greater than the switching losses. In this example, the switching elements of the second plurality of switching elements 122 may also generate switching losses and conduction losses, wherein the switching losses are greater than the conduction losses.

Electrical terminals that are configured to electrically couple the substrates 10$_1$, 10$_2$ and the semiconductor bodies mounted thereon to the respective electrical potentials may be arranged on the first substrate 10$_1$ or on the second substrate 10$_2$.

The separation of semiconductor bodies with different thermal and electrical characteristics on separate substrates 10$_1$, 10$_2$ results in an increased overall thermal and electrical performance of the, power semiconductor arrangement. A substrate having an increased thermal performance (increased thermal conductivity) is generally more expensive as compared to substrates having a lower thermal performance (low thermal conductivity). During operation of the power semiconductor module arrangement, fast switching elements may generate more heat than slow switching elements, for example. Arranging both the fast switching elements and the slow switching elements on a single substrate having a high thermal performance (high thermal conductivity) may increase the overall cost of the power semiconductor module, as the surface area of the single substrate is required to be comparably large to accommodate both the switching elements of the first plurality of switching elements 121 and the switching elements of the second plurality of switching elements 122. Therefore, using separate substrates 10$_1$, 10$_2$, with different thermal and/or electrical performances may significantly reduce the cost of the power semiconductor module. The surface area of the more expensive substrate having a high thermal and/or electrical performance may be decreased and the remaining surface area may be provided on a less costly substrate having a reduced thermal and/or electrical performance, According to one example, the first substrate 10$_1$ may consist of or include AlN, wherein the first sub-group 121$_1$ of the switching elements of the first plurality of switching elements 121 is arranged on the first substrate 10$_1$. The second substrate 10$_2$ may consist of or may include $Al_2O_3$, for example, wherein the third sub-group 122$_3$ of the switching elements of the second plurality of switching elements 122 is arranged on the second substrate 10$_2$. The materials mentioned above, however, are merely examples. The first substrate 10$_1$, and the second substrate 10$_2$ may consist of or may include any other suitable materials, wherein at least one of the materials may be different for the different substrates 10$_1$, 10$_2$.

The terminal elements 14 that are used to electrically contact the first substrate 10$_1$ may have the same or may have different thermal and electrical properties than the terminal elements 14 that are used to electrically contact the second substrate 10$_2$. For example, terminal elements 14 that are used to electrically contact the first substrate 10$_1$ may have a higher power cycling resistance than the terminal elements 14 that are used to electrically contact the second semiconductor substrate 10$_2$, or vice versa, depending on the electrical and thermal properties of the respective substrate 10$_1$, 10$_2$, and of the semiconductor bodies mounted thereon. For example, the power cycling resistance of the terminal elements 14 electrically coupling the first substrate 10$_1$ may be higher than the power cycling resistance of the terminal elements 14 electrically contacting the second substrate 10$_2$, if the first plurality of switching elements 121 comprises fast switching elements and the second plurality of switching elements 122. comprises slow switching elements. The same applies for any other structures and connection elements of the respective substrates 10$_1$, 10$_2$ such as electrically conductive connection layers 130, metallization layers 111, 112 or electrical connections 13, for example.

In order to improve the electromagnetic compatibility of a substrate 10$_1$, 10$_2$, an additional shielding element may be provided for at least one of the substrates 10$_1$, 10$_2$. For example, it may be sufficient to provide an additional shielding elements only for the first substrate 10$_1$, but not for the second substrate 10$_2$, if the first plurality of switching elements 121 comprises fast switching elements and the second plurality of switching elements 122 comprises slow switching elements, or if the switching elements of the first plurality of switching elements 121 generate conduction losses that are higher than the switching losses and the switching elements of the second plurality of switching elements 122 generate switching losses that are higher than the conduction losses, for example. For example, the first substrate 10$_1$ may be an insulated Metal Substrate (IMS) with an additional electrically conducting shielding. The second substrate $10_2$ may be a conventional substrate other than an IMS without additional shielding.

According to another example, in addition to the switching elements of the first plurality of switching elements 121 (and optionally of the second plurality of switching elements 122) a plurality of capacitive elements may be mounted on the first substrate $10_1$. Such capacitive elements may be arranged symmetrically on the first substrate $10_1$ in order to prevent an asymmetric switching characteristic of the semiconductor arrangement, for example. An additional structuring of the second metallization layer 112 of the first substrate 101 may additionally contribute to a symmetric switching characteristic of the semiconductor arrangement. For the second substrate $10_2$ with the slow switching elements (or alternatively elements that generate switching losses that are higher than the conduction losses) mounted thereon, it may not be necessary to structure the second metallization layer 122. Further, it may not be necessary to symmetrically arrange capacitive elements on the second substrate $10_2$ if there are any capacitive elements mounted on the second substrate $10_2$.

In the arrangement of FIG. 2, an additional capacitive element may be arranged between the second load electrode (e.g. collector electrode or drain electrode) of the fifth controllable semiconductor element T5, and the first load electrode (e.g. source electrode or emitter electrode) of the sixth controllable semiconductor element T6 (additional capacitive element not illustrated in FIG. 2). Such an additional capacitive element may be implemented as an additional semiconductor body 120, for example. This additional semiconductor body 120 may be mounted on either the first substrate $10_1$, or the second substrate $10_2$, or may be mounted on an external printed circuit board (PCB) that is arranged separate to the substrates $10_1$, $10_2$ (e.g., outside the housing 17) but is electrically coupled to the substrates $10_1$, $10_2$.

Figure 6:
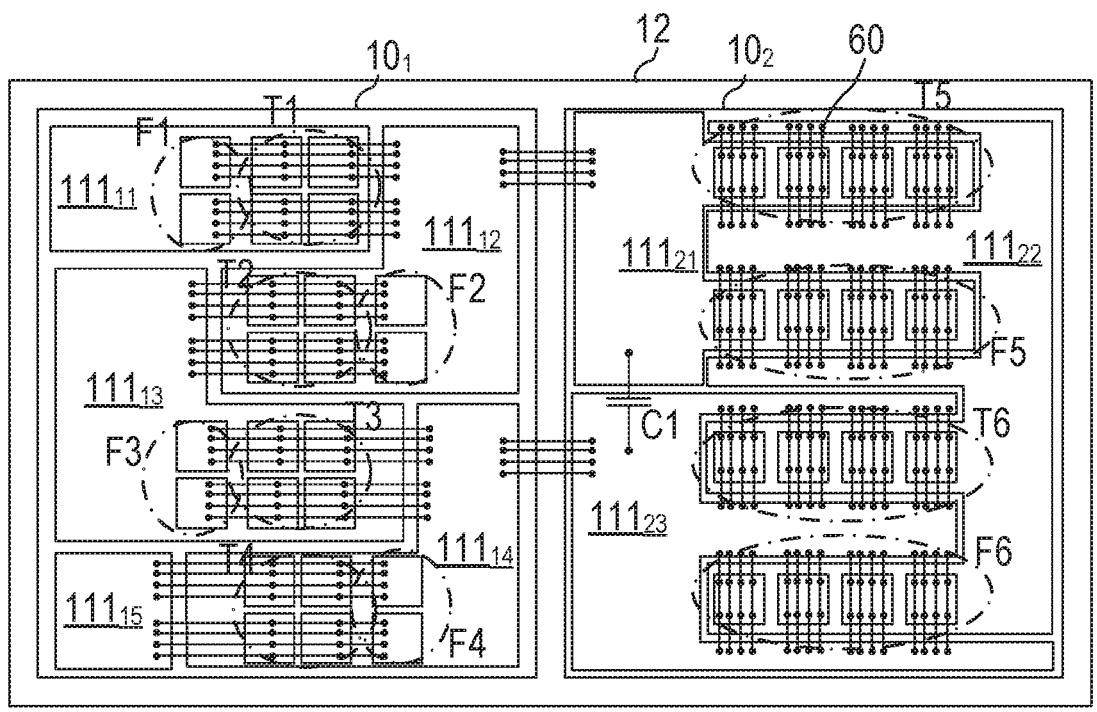
FIG. 6 is a top view of another exemplary semiconductor module arrangement.

A semiconductor arrangement according to FIG. 2 that is implemented on two separate substrates $10_1$, $10_2$ is exemplarily illustrated in FIG. 6. In the example of FIG. 6, a first substrate $10_1$ and a second substrate $10_2$ are arranged on a base plate 12. The base plate 12 may be arranged in or may form a bottom of a housing 17 (housing not specifically illustrated in FIG. 6). According to other example, however, the base plate 12 may be omitted. It is also possible to arrange the first and the second substrate $10_1$, $10_2$ in a frame and arrange the housing 17 such that the frame with the substrates $10_1$, $10_2$ forms the bottom of the housing 17. The first substrate $10_1$ comprises a first metallization layer $111_1$, as has been described with respect to FIG. 1 above. In the example of FIG. 6, the first metallization layer $111_1$ comprises five different individual sections. The first controllable semiconductor element T1 of the ANPC topology illustrated in FIG. 2 may be arranged on a first section $111_{11}$ of the first metallization layer $111_1$. For example, a drain or collector electrode of the first controllable semiconductor element T1 may be electrically coupled to the first section $111_{11}$. The first section $111_{11}$ may be coupled to the first potential (DC+). The first freewheeling element F1 may also be arranged on the first section $111_{11}$. In particular, a cathode electrode of the first freewheeling element E1 may be electrically coupled to the first section $111_{11}$. The second controllable semiconductor element T2 as well as the second freewheeling element F2 may be arranged on a second section $111_{12}$ of the first metallization layer $111_1$. For example, a drain or collector electrode of the second controllable semiconductor element T2 and a cathode electrode of the second freewheeling element F2 may be coupled to the second section $111_{12}$ For example, an emitter or source electrode of the first controllable semiconductor element T1 and an anode electrode of the first freewheeling element F1 may be electrically coupled to the second section $111_{12}$ (e.g., by means of bonding wires). The third controllable semiconductor element T3 as well as the third freewheeling element F3 may be arranged on a third section $111_{13}$ of the first metallization layer $111_1$. For example, a drain or collector electrode of the third controllable semiconductor element T3 and a cathode electrode of the third freewheeling element F3 may be coupled to the third section $111_{13}$. An emitter or source electrode of the second controllable semiconductor element T2 and an anode electrode of the second freewheeling element F2 may be electrically coupled to the third section $111_{13}$ (e.g., by means of bonding wires). The fourth controllable semiconductor element T4 and the fourth freewheeling element F4 may be mounted on a fourth section $111_{14}$ of the first metallization layer $111_1$. For example, a drain or collector electrode of the fourth controllable semiconductor element T4 and a cathode electrode of the fourth freewheeling element F4 may be electrically coupled to the fourth section $111_{14}$. An emitter or source electrode of the third controllable semiconductor element T3 and a cathode electrode of the third freewheeling element F3 may be electrically coupled to the fourth section $111_{14}$ (e.g., by means of bonding wires). A fifth section $111_{15}$ of the first metallization layer $111_1$ may be electrically coupled to the third electrical potential (DC−). An emitter or source electrode of the fourth controllable semiconductor element T4 and an anode electrode of the fourth freewheeling element F4 may be electrically coupled to the fifth section $111_{15}$.

The second substrate $10_2$ in the example of FIG. 6 comprises a first metallization layer $111_2$ having three different sections. The fifth controllable semiconductor element T5 and the fifth freewheeling element. F5 may be mounted on a first section of the first metallization layer $111_2$. In particular, a drain or collector electrode of the fifth controllable semiconductor element T5 and a cathode electrode of the firth freewheeling element F5 may be electrically coupled to the first section $111_{21}$. The sixth controllable semiconductor element T6 and the sixth freewheeling element P6 are arranged on a second section $111_{22}$ of the first metallization layer $111_2$ of the second substrate $10_2$. In particular, drain or collector electrode of the sixth controllable semiconductor element T6 and a cathode electrode of the sixth freewheeling element F6 may be electrically coupled to the second section $111_{22}$. An emitter or source electrode of the fifth controllable semiconductor element T5 and an anode electrode of the fifth freewheeling element F5 may be electrically coupled to the second section $111_{22}$ of the first metallization layer $111_2$ (e.g., by means of bonding wires). An emitter or source electrode of the sixth controllable semiconductor element T6 and an anode electrode of the sixth freewheeling element F6 may be electrically coupled to a third section $111_{23}$ of the first metallization layer $111_2$ (e.g., by means of bonding wires). The second section may be electrically coupled to or form the output node OUT of the arrangement.

Similar to what has been described with respect to the controllable semiconductor elements above, the semiconductor arrangement may comprise a first plurality of freewheeling elements (e.g., diodes). Each freewheeling element of the first plurality of freewheeling elements may be coupled in parallel to one of the controllable semiconductor elements of the first plurality of controllable semiconductor elements. In particular, the first plurality of freewheeling elements may comprise at least a first sub-group, wherein each freewheeling element of the first sub-group is coupled in parallel to one of the controllable semiconductor elements of the first sub-group of the first plurality of controllable semiconductor elements. The semiconductor arrangement may further comprise a second plurality of freewheeling elements (e.g., diodes). Each freewheeling element of the second plurality of freewheeling elements may be coupled in parallel to one controllable semiconductor element of the second plurality of controllable semiconductor elements. In particular, the second plurality of freewheeling elements may comprise at least a first sub-group, wherein each freewheeling element of the first sub-group is coupled in parallel to one of the controllable semiconductor elements of the first sub-group of the second plurality of controllable semiconductor elements.

The first section $111_{21}$ of the first metallization layer $111_2$ of the second substrate $10_2$ may be electrically coupled to the second section $111_{12}$ of the first metallization layer $111_1$ of the first substrate $10_1$ (e.g., by means of bonding wires), and the third section of the first metallization layer $111_2$ of the second substrate $10_2$ may be electrically coupled to the fourth section $111_{14}$ of the first metallization layer $111_1$ of the first substrate $10_1$ (e.g., by means of bonding wires).

As has been described above, an additional capacitive element C1 may be arranged on the second substrate $10_2$. The additional capacitive element C1 is only schematically indicated in the arrangement of FIG. 6. According to one example, the additional capacitive element C1 may be arranged on the third section $111_{23}$ of the first metallization layer $111_2$ of the second substrate $10_2$ and may be electrically coupled to the first section $111_{21}$ of the first metallization layer $111_2$ of the second substrate $10_2$. This additional capacitive element C1 may operate as a snubber element and suppress or reduce voltage transients. The additional capacitive element C1 further may reduce the stray inductance of the semiconductor arrangement and, therefore, reduces any over voltages occurring in the semiconductor arrangement which may potentially damage the semiconductor bodies. This allows for a faster switching process of the switching elements.

An additional capacitive element C1 may further reduce the steepness of the edges of the voltages occurring in the semiconductor arrangement during the switching processes. Less steep slopes during the switching operations generally improve electromagnetic compatibility of the semiconductor arrangement.

Even further, the additional capacitive element C1, together with the intrinsic inductivity of the electrical connection elements (e.g., bonding wires) that are used to electrically couple the first section $111_{21}$ to the third section $111_{23}$, may form a low pass filter (as seen from the phase output OUT towards the input voltages (DC+, DC−)—In this way, any over voltage peaks occurring during the switching operations of the semiconductor arrangement may be filtered and are not transferred towards the input side (e.g., towards first common node P and second common node N). T This allows to implement the first, second, third and fourth controllable switching elements T1, T2, T3, T4 with a lower maximum blocking voltage as compared to the fifth and sixth controllable switching elements T5, T6. This is because short-term over voltages are shorted by the LC-filter. Generally, lower blocking voltages result in lower forward losses, which leads to an optimization of the loss ratio within the semiconductor arrangement.

The examples in FIGS. 5 and 6 are illustrated by means of a power semiconductor module comprising two individual substrates $10_1$, $10_2$. However, the general principle as described with respect to FIGS. 5 and 6 may also be applied to power semiconductor modules comprising more than two individual substrates. That is, the overall performance may be further optimized by using more than two different substrates, each of the different substrates being optimized with regard to the semiconductor devices mounted thereon and their specific function and electrical and thermal properties.

Generally, in order to reduce the stray inductance of the power semiconductor module, the terminal elements may be positioned adjacent to each other as close as possible within the power semiconductor module. This reduces or limits any parasitic effects such as shut-off over voltages or forward recovery effects. Further, it may be desirable to optimize the commutation paths on the substrates of the power semiconductor module. A commutation path may be optimized, for example, by reducing the length of the paths the currents have to travel and further by reducing the number of bonding connections within the power semiconductor module. This helps to avoid any additive parasitic stray inductances in addition to the stray inductances of the input terminals (DC+, DC−). Any uboptimal commutation paths may result in unwanted resonant circuits (e.g., stray inductance together with capacities of semiconductor bodies or of the substrates) which may further lead to additional oscillations that may negatively affect the electromagnetic compatibility of the power semiconductor module.

Any semiconductor devices that are stressed more heavily during the operation of the power semiconductor module arrangement than other semiconductor devices may be spatially separated from those semiconductor devices that are less heavily stressed.

In the examples described above with respect to the Figures, the controllable semiconductor elements of the first plurality of controllable semiconductor elements have been described as being fast switching elements, while the controllable semiconductor elements of the second plurality of controllable semiconductor elements have been described as being slow switching elements. That is, the thermal and/or electrical properties of the substrates have been described as being optimized either for fast switching elements or slow switching elements. This, however, is only an example. It is also possible to optimize the different substrate with regard to other properties of the controllable semiconductor elements mounted thereon. For example, each of the controllable semiconductor elements may have a maximum permissible temperature. A maximum permissible temperature is generally a maximum operating temperature up to which the specific controllable semiconductor element may be safely operated. Exceeding the maximum permissible temperature may led to a thermal destruction of the respective controllable semiconductor element. The maximum operating temperature of a controllable semiconductor element is generally defined in the corresponding data sheet of the controllable semiconductor element, wherein the data sheet is issued by the manufacturer of the controllable semiconductor element.

According to one example, each controllable semiconductor element of the first plurality of controllable semiconductor elements has a maximum permissible temperature, wherein during operation of the semiconductor module arrangement, each controllable semiconductor element of the first plurality of controllable semiconductor elements reaches its maximum permissible temperature. Each controllable semiconductor element of the second plurality of controllable semiconductor elements, on the other hand, may have a maximum permissible temperature, wherein during operation of the semiconductor module arrangement each controllable semiconductor element of the second plurality of controllable semiconductor elements does not reach its maximum permissible temperature.

At least a first sub-group of the first plurality of controllable semiconductor elements (first sub-group comprises >50%, >60%, >75%, >90%, or =100% of the overall number of controllable semiconductor elements of the first plurality of controllable semiconductor elements) may be mounted on a first substrate. At least a first sub-group of the second plurality of controllable semiconductor elements (first sub-group comprises >50%, >60%, >75%, >90%, or =100% of the overall number of controllable semiconductor elements of the second plurality of controllable semiconductor elements) may be mounted on a second substrate. The first substrate may have, e.g., optimized thermal properties as compared to the thermal properties of the second substrate. That is, the thermal conductivity of the first substrate may be higher than the thermal conductivity of the second substrate. In this way, heat may be dissipated away more effectively at least from the first sub-group of the first plurality of controllable semiconductor elements, which generate more heat during operation than the controllable semiconductor elements of the second plurality of controllable semiconductor elements. The controllable semiconductor elements of the second plurality of controllable semiconductor elements, on the other hand, may be mounted on a substrate which has poorer thermal properties as compared to the first substrate. This may be sufficient for the controllable semiconductor elements of the second plurality of controllable semiconductor elements, which generate less heat (as compared to the controllable semiconductor elements of the first plurality) during operation of the semiconductor module arrangement.

Substrates having a better thermal performance are usually more expensive than substrates having a poorer thermal performance. Therefore, part of the substrate area may be provided by a less costly substrate. As has been described above, also in this example it is possible to provide more than two substrates within the same package to provide further optimization for the overall semiconductor module arrangement.

In the example illustrated above, the different semiconductor substrates of a semiconductor module arrangement may comprise different materials in order to, e.g., provide different electrical and/or thermal performances for different kinds of controllable semiconductor elements. This, however, is only an example. Alternatively or additionally the different substrates may comprise different thicknesses in a vertical direction y, for example. According to one example, the dielectrically insulating layer $11_1$ of the first semiconductor substrate $10_1$ has a first thickness in the vertical direction y that is different from a second thickness of the dielectrically insulating layer $11_2$ of the second semiconductor substrate $10_2$. The vertical direction is perpendicular to the rear surface of the first semiconductor substrate $10_1$ and to the rear surface of the second semiconductor substrate $10_2$. The rear surface of a semiconductor substrate is a surface that is parallel to the top surface of the respective semiconductor substrate, wherein the top surface is a surface on which at least one controllable semiconductor element is mounted. Alternatively or additionally, the second metallization layer $112_1$ of the first semiconductor substrate $10_1$ is a structured layer including recesses between different sections of the layer. The different sections of the second metallization layer $112_1$ of the first semiconductor substrate $10_1$ are arranged in a first pattern. The second metallization layer $112_2$ of the second semiconductor substrate $10_2$ is also a structured layer including recesses between different sections of the layer, wherein the different sections of the second metallization layer $112_2$ of the second semiconductor substrate $10_2$ are arranged in a second pattern that is different from the first pattern. According to an even further example, the second metallization layer $112_1$ of the first semiconductor substrate $10_1$ is a structured layer whereas the second metallization layer $112_2$ of the second semiconductor substrate $10_2$ is a continuous layer.

What is claimed is:

1. A semiconductor module arrangement, comprising:
a housing;
a first semiconductor substrate arranged inside the housing;
a second semiconductor substrate arranged inside the housing;
a first plurality of controllable semiconductor elements; and
a second plurality of controllable semiconductor elements,
wherein:
during operation of the semiconductor module arrangement, each controllable semiconductor element of the first plurality of controllable semiconductor elements generates switching losses and conduction losses, the switching losses being greater than the conduction losses;
during operation of the semiconductor module arrangement, each controllable semiconductor element of the second plurality of controllable semiconductor elements generates switching losses and conduction losses, the conduction losses being greater than the switching losses;
at least a first sub-group of the first plurality of controllable semiconductor elements is arranged on the first semiconductor substrate; and
at least a first sub-group of the second plurality of controllable semiconductor elements is arranged on the second semiconductor substrate.

2. The semiconductor module arrangement of claim 1, wherein:
the first sub-group of the first plurality of controllable semiconductor elements comprises more than 50%, more than 60%, more than 75%, or more than 90% of the controllable semiconductor elements of the first plurality of controllable semiconductor elements; and
the first sub-group of the second plurality of controllable semiconductor elements comprises more than 50%, more than 60%, more than 75%, or more than 90% of the controllable semiconductor elements of the second plurality of controllable semiconductor elements.

3. The semiconductor module arrangement of claim 1, wherein the first plurality of controllable semiconductor elements is electrically coupled to the second plurality of controllable semiconductor elements.

4. The semiconductor module arrangement of claim 1, wherein during operation of the semiconductor module arrangement, at least one commutation path passes both the first semiconductor substrate and the second semiconductor substrate.

5. The semiconductor module arrangement of claim 1, wherein:
the first semiconductor substrate comprises a dielectrically insulating layer comprising at least a first material; and the second semiconductor substrate comprises a dielectrically insulating layer comprising at least a second material that is not included in the dielectrically insulating layer of the first substrate.

6. The semiconductor module arrangement of claim 5, further comprising at least one electrical connection element, wherein:
the first semiconductor substrate comprises a first metallization layer arranged on a first surface of its respective dielectrically insulating layer;
the second semiconductor substrate comprises a first metallization layer arranged on a first surface of its respective dielectrically insulating layer; and
the at least one electrical connection element is configured to:
electrically couple the first metallization layer of the first semiconductor substrate to the first metallization layer of the second semiconductor substrate;
electrically couple one of the controllable semiconductor elements of the first plurality of controllable semiconductor elements to one of the controllable semiconductor elements of the second plurality of controllable semiconductor elements;
electrically couple one of the controllable semiconductor elements of the first plurality of controllable semiconductor elements to the first metallization layer of the second semiconductor substrate; or
electrically couple one of the controllable semiconductor elements of the second plurality of controllable semiconductor elements to the first metallization layer of the first semiconductor substrate.

7. The semiconductor module arrangement of claim 6, wherein the at least one electrical connection element comprises a bonding wire, a bonding ribbon, a connection plate, or a conductor rail.

8. The semiconductor module arrangement of claim 1,
wherein the first semiconductor substrate comprises a dielectrically insulating layer and a second metallization layer arranged on a rear surface of the dielectrically insulating layer, and the second semiconductor substrate comprises a dielectrically insulating layer and a second metallization layer arranged on a rear surface of the dielectrically insulating layer, and
wherein (a) the dielectrically insulating layer of the first semiconductor substrate has a first thickness in a vertical direction that is different from a second thickness of the dielectrically insulating layer of the second semiconductor substrate, the vertical direction being perpendicular to the rear surface of the first semiconductor substrate and the rear surface of the second semiconductor substrate, or (b) the second metallization layer of the first semiconductor substrate is a structured layer including recesses between different sections of the layer, the different sections of the second metallization layer of the first semiconductor substrate being arranged in a first pattern, the second metallization layer of the second semiconductor substrate being a structured layer including recesses between different sections of the layer, the different sections of the second metallization layer of the second semiconductor substrate being arranged in a second pattern that is different from the first pattern, or both (a) and (b).

9. The semiconductor module arrangement of claim 8, further comprising at least one electrical connection element, wherein:
the first semiconductor substrate comprises a first metallization layer arranged on a first surface of its respective dielectrically insulating layer;
the second semiconductor substrate comprises a first metallization layer arranged on a first surface of its respective dielectrically insulating layer; and
the at least one electrical connection element is configured to:
electrically couple the first metallization layer of the first semiconductor substrate to the first metallization layer of the second semiconductor substrate;
electrically couple one of the controllable semiconductor elements of the first plurality of controllable semiconductor elements to one of the controllable semiconductor elements of the second plurality of controllable semiconductor elements;
electrically couple one of the controllable semiconductor elements of the first plurality of controllable semiconductor elements to the first metallization layer of the second semiconductor substrate; or
electrically couple one of the controllable semiconductor elements of the second plurality of controllable semiconductor elements to the first metallization layer of the first semiconductor substrate.

10. The semiconductor module arrangement of claim 9, wherein the at least one electrical connection element comprises a bonding wire, a bonding ribbon, a connection plate, or a conductor rail.

11. The semiconductor module arrangement of claim 1, further comprising:
a first plurality of diode elements; and
a second plurality of diode elements,
wherein at least a first sub-group of the first plurality of diode elements is arranged on the first semiconductor substrate, and
wherein at least a first sub-group of the second plurality of diode elements is arranged on the second semiconductor substrate.

12. The semiconductor module arrangement of claim 11, wherein:
each diode element of the first sub-group of the first plurality of diode elements is coupled in parallel to a corresponding one of the controllable semiconductor elements of the first sub-group of the first plurality of controllable semiconductor elements; and
each diode element of the first sub-group of the second plurality of diode elements is coupled in parallel to a corresponding one of the controllable semiconductor elements of the first sub-group of the second plurality of controllable semiconductor elements.

13. The semiconductor module arrangement of claim 1, wherein at least one of:
the first semiconductor substrate has a thermal design which differs from a thermal design of the second semiconductor substrate, the thermal design of each semiconductor substrate affecting the temperature of the controllable semiconductor elements mounted to that semiconductor substrate; and
the first semiconductor substrate has an electrical design which differs from an electrical design of the second semiconductor substrate, the electrical design of each semiconductor substrate affecting a switching behavior of the controllable semiconductor elements mounted to that semiconductor substrate.

14. The semiconductor module arrangement of claim 1, wherein the first plurality of controllable semiconductor elements and the second plurality of controllable semiconductor elements are arranged in a neutral point clamped topology, or an active neutral point clamped topology.

15. The semiconductor module arrangement of claim 1, wherein at least one of the first semiconductor substrate and the second semiconductor substrate comprises an additional electrically conducting shielding element that is configured to improve the electromagnetic compatibility of the respective semiconductor substrate.

16. The semiconductor module arrangement of claim 1, further comprising at least one capacitive element arranged on the second semiconductor substrate and configured to suppress or reduce voltage transients occurring in the semiconductor module arrangement.

17. The semiconductor module arrangement of claim 1, further comprising at least one of:
   a plurality of electrical connection elements configured to electrically couple elements arranged on the first semiconductor substrate and the second semiconductor substrate with each other;
   a plurality of electrically conductive connection layers configured to electrically couple the controllable semiconductor elements of the first plurality and the second plurality of controllable semiconductor elements to the respective first or second semiconductor substrate;
   a first metallization layer arranged on a first surface of the first semiconductor substrate;
   another first metallization layer arranged on a first surface of the second semiconductor substrate; and
   a plurality of terminal elements configured to electrically contact the first substrate and the second substrate from outside the housing,
   wherein connection elements, electrically conductive connection layers, a first metallization layer and/or terminal elements that are arranged on the second semiconductor substrate have a power cycling resistance that differs from a power cycling resistance of connection elements, electrically conductive connection layers, a first metallization layer and/or terminal elements that are arranged on the first semiconductor substrate.

18. The semiconductor module arrangement of claim 17, wherein the connection elements, electrically conductive connection layers, first metallization layer and/or terminal elements that are arranged on the second semiconductor substrate have a higher power cycling resistance than the connection elements, electrically conductive connection layers, first metallization layer and/or terminal elements that are arranged on the first semiconductor substrate.

19. The semiconductor module arrangement of claim 1, wherein:
   each of the controllable semiconductor elements of the first plurality of controllable semiconductor elements comprises at least one of an IGBT, a MOSFET, a JFET, or a HEMT; and
   each of the controllable semiconductor elements of the second plurality of controllable semiconductor elements comprises at least one of an IGBT, a MOSFET, a JFET, or a HEMT.

20. A semiconductor module arrangement, comprising:
   a housing;
   a first semiconductor substrate arranged inside the housing;
   a second semiconductor substrate arranged inside the housing;
   a first plurality of controllable semiconductor elements; and
   a second plurality of controllable semiconductor elements,
   wherein:
   each controllable semiconductor element of the first plurality of controllable semiconductor elements has a maximum permissible temperature;
   during operation of the semiconductor module arrangement, each controllable semiconductor element of the first plurality of controllable semiconductor elements reaches its maximum permissible temperature;
   each controllable semiconductor element of the second plurality of controllable semiconductor elements has a maximum permissible temperature;
   during operation of the semiconductor module arrangement, each controllable semiconductor element of the second plurality of controllable semiconductor elements does not reach its maximum permissible temperature;
   at least a first sub-group of the first plurality of controllable semiconductor elements is arranged on the first semiconductor substrate; and
   at least a first sub-group of the second plurality of controllable semiconductor elements is arranged on the second semiconductor substrate.

21. The semiconductor module arrangement of claim 20, wherein the maximum permissible temperature of a controllable semiconductor element is a maximum operating temperature defined in a data sheet of the controllable semiconductor element up to which the controllable semiconductor element may be safely operated, and wherein exceeding the maximum permissible temperature may lead to a thermal destruction of the respective controllable semiconductor element.

* * * * *